(12) United States Patent
Park et al.

(10) Patent No.: US 7,675,091 B2
(45) Date of Patent: Mar. 9, 2010

(54) SEMICONDUCTOR WAFER AND METHOD OF FABRICATING THE SAME

(75) Inventors: Young-Soo Park, Gyeonggi-do (KR); Kyoo-Chul Cho, Gyeonggi-do (KR); Shin-Hyeok Han, Seoul (KR); Tae-Soo Kang, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 322 days.

(21) Appl. No.: 11/463,137

(22) Filed: Aug. 8, 2006

(65) Prior Publication Data
US 2007/0034950 A1     Feb. 15, 2007

(30) Foreign Application Priority Data
Aug. 9, 2005     (KR)     .............. 10-2005-0072928

(51) Int. Cl.
*H01L 29/80*     (2006.01)

(52) U.S. Cl. ............. 257/204; 438/455; 438/460; 438/471; 257/619; 257/620; 257/621; 257/628; 257/527; 257/594; 257/618; 257/622; 257/E21.122; 257/E21.123; 257/E21.124; 257/E21.567

(58) Field of Classification Search ........... 257/204, 257/618–628; 438/455, 460, 471, 461, 481, 438/150, 198, 429, 458
See application file for complete search history.

(56) References Cited

U.S. PATENT DOCUMENTS

| | | | | |
|---|---|---|---|---|
| 4,933,298 A | * | 6/1990 | Hasegawa | ............. 438/150 |
| 5,037,776 A | | 8/1991 | Galeuchet et al. | |
| 5,157,466 A | * | 10/1992 | Char et al. | ............. 257/33 |
| 6,352,909 B1 | * | 3/2002 | Usenko | ............. 438/458 |
| 6,794,718 B2 | * | 9/2004 | Nowak et al. | ............. 257/347 |
| 6,812,116 B2 | * | 11/2004 | Huang et al. | ............. 438/464 |
| 6,815,278 B1 | * | 11/2004 | Ieong et al. | ............. 438/198 |
| 6,821,826 B1 | | 11/2004 | Chan et al. | |
| 6,830,962 B1 | * | 12/2004 | Guarini et al. | ............. 438/149 |
| 6,836,001 B2 | * | 12/2004 | Yamauchi et al. | ............. 257/627 |
| 6,902,962 B2 | * | 6/2005 | Yeo et al. | ............. 438/150 |
| 6,946,371 B2 | * | 9/2005 | Langdo et al. | ............. 438/481 |
| 6,995,456 B2 | * | 2/2006 | Nowak | ............. 257/627 |

(Continued)

FOREIGN PATENT DOCUMENTS

KR     1999-0082490     11/1999

(Continued)

*Primary Examiner*—N Drew Richards
*Assistant Examiner*—Swapneel Chhaya
(74) *Attorney, Agent, or Firm*—Myers Bigel Sibley & Sajovec, P.A.

(57) ABSTRACT

Disclosed is a semiconductor wafer and method of fabricating the same. The semiconductor wafer is comprised of a semiconductor layer formed on an insulation layer on a base substrate. The semiconductor layer includes a surface region organized in a first crystallographic orientation, and another surface region organized in a second crystallographic orientation. The performance of a semiconductor device with unit elements that use charges, which are activated in high mobility to the crystallographic orientation, as carriers is enhanced. The semiconductor wafer is completed by forming the semiconductor layer with the second crystallographic orientation on the plane of the first crystallographic orientation, growing an epitaxial layer, forming the insulation layer on the epitaxial layer, and then bonding the insulation layer to the base substrate.

8 Claims, 3 Drawing Sheets

U.S. PATENT DOCUMENTS

| | | | | |
|---|---|---|---|---|
| 6,998,684 | B2* | 2/2006 | Anderson et al. | 257/351 |
| 7,023,055 | B2* | 4/2006 | Ieong et al. | 257/369 |
| 7,087,965 | B2* | 8/2006 | Chan et al. | 257/347 |
| 7,094,634 | B2* | 8/2006 | Zhu et al. | 438/150 |
| 7,122,449 | B2* | 10/2006 | Langdo et al. | 438/481 |
| 7,189,632 | B2* | 3/2007 | Kerdiles et al. | 438/458 |
| 7,250,656 | B2* | 7/2007 | Haensch et al. | 257/347 |
| 7,271,043 | B2* | 9/2007 | Zhu et al. | 438/199 |
| 7,312,136 | B2* | 12/2007 | Huang et al. | 438/478 |
| 7,319,258 | B2* | 1/2008 | Yang et al. | 257/347 |
| 7,329,923 | B2* | 2/2008 | Doris et al. | 257/347 |
| 7,332,384 | B2* | 2/2008 | Buchholtz et al. | 438/150 |
| 2004/0195646 | A1 | 10/2004 | Yeo et al. | |
| 2004/0256700 | A1* | 12/2004 | Doris et al. | 257/627 |
| 2005/0045995 | A1* | 3/2005 | Ieong et al. | 257/627 |
| 2005/0045996 | A1* | 3/2005 | Yamauchi et al. | 257/627 |
| 2005/0048739 | A1* | 3/2005 | Kerdiles et al. | 438/458 |
| 2005/0093104 | A1* | 5/2005 | Ieong et al. | 257/627 |
| 2005/0199984 | A1* | 9/2005 | Nowak | 257/627 |
| 2006/0006389 | A1* | 1/2006 | Buchholtz et al. | 257/70 |
| 2006/0024931 | A1* | 2/2006 | Chan et al. | 438/528 |
| 2006/0073646 | A1* | 4/2006 | Yang | 438/152 |
| 2006/0131699 | A1* | 6/2006 | Raab et al. | 257/627 |

FOREIGN PATENT DOCUMENTS

| | | |
|---|---|---|
| KR | 10-2004-0020024 | 3/2004 |
| KR | 10-2005-0015995 | 2/2005 |

* cited by examiner

SEMICONDUCTOR WAFER AND METHOD OF FABRICATING THE SAME

CROSS-REFERENCE TO RELATED APPLICATIONS

This application claims priority under 35 U.S.C. § 119 from Korean Patent Application No. 2005-72928 filed on Aug. 9, 2005, the contents of which are incorporated herein by reference in their entirety.

BACKGROUND

1. Technical Field

The subject matter described herein is concerned with wafers for fabricating semiconductor devices and methods of fabricating the same. In particular, the subject matter relates to a wafer in which a semiconductor layer is formed on an insulation film, and a method of fabricating the same.

2. Description of the Related Art

Active and passive elements constituting a semiconductor device are usually fabricated on a semiconductor wafer having a single crystalline orientation. High-performance semiconductor devices are needed to have high-frequency operations, lower power consumption, and to be free from malfunctions caused by undesired current paths. Those requirements for the semiconductor devices may be accomplished by adopting low-resistive interconnections, improving junction structures, providing high mobility of charges, reducing leakage currents, interrupting abnormal current paths, and so forth.

Transistors as typical kinds of the semiconductor devices are classified into NMOS transistors using electrons as carriers, and PMOS transistors using holes as carriers. It is known that electrons have a higher mobility when traveling normal to the (100) crystallographic orientation while the holes have a higher mobility when traveling normal to the (110) crystallographic orientation. The NMOS transistors are dominantly used in a general semiconductor device. The mobility of holes in a substrate with the (100) orientation is lower than that of electrons by two to four times. In order to compensate such a difference of mobility between electrons and holes, the PMOS transistor is designed to have a wider channel width, which increases an area of the semiconductor device. To the contrary, the mobility of holes is mostly twice that of electrons in the (110)-oriented substrate. Accordingly, the PMOS transistor is ideally fabricated in the (110)-oriented substrate, while the NMOS transistor is ideally fabricated in the (100)-oriented substrate.

SUMMARY

The invention is directed to a semiconductor wafer and/or method of fabricating the same, suitable for fabricating a high-performance semiconductor device that is operable in high frequency and lower power consumption applications, and free from malfunctions due to undesired current paths.

The invention is also directed to a semiconductor wafer and/or method of fabricating the same, suitable for preparing a substrate that has a device using electrons as carries and a device using holes as carriers with crystallographic orientations for high mobility of the electrons and holes.

In order to achieve these technical objectives, the invention provides a semiconductor wafer in which a semiconductor layer, having regions different in crystallographic orientation, is formed on an insulation film, and a method of processing the same is also provided.

The semiconductor wafer is comprised of a semiconductor layer formed on an insulation layer on a base substrate. The semiconductor layer includes a surface region having a first crystallographic orientation, and another surface region having a second crystallographic orientation. The layer is able to enhance the performance of a semiconductor device with unit elements that use charges as carriers, which are transported in high mobility due to the crystallographic orientation.

The semiconductor layer includes one selected from group IV semiconductors, III/V-group compound semiconductors, and II/VI-group compound semiconductors. The semiconductor layer may further comprise surface layers formed on the semiconductor layer, corresponding to the first and second crystallographic orientations.

In some embodiments of the invention, the first and second crystallographic orientations may be (110) and (100), or (100) and (110), respectively. The semiconductor layer of the (100) crystallographic orientation is used as a region for an NMOS transistor that is operable with electrons as majority carriers, while the semiconductor layer of the (110) crystallographic orientation is used as a region for a PMOS transistor that is operable with holes as majority carriers. Thus, it is possible to form semiconductor layers with crystallographic orientations suitable for regions in which unit elements are operable with best conditions in a semiconductor device.

BRIEF DESCRIPTION OF THE FIGURES

The accompanying figures are included to provide a further understanding of the invention, and are incorporated in and constitute a part of this specification. The drawings illustrate example embodiments of the invention and, together with the description, serve to explain principles of the present invention. In the figures.

DETAILED DESCRIPTION OF PREFERRED EMBODIMENTS

Figure 1:
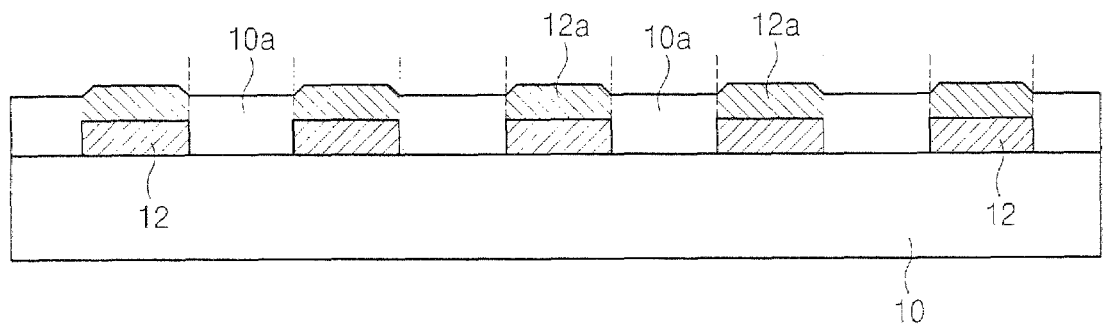
FIGS. 1 through 6 are sectional views illustrating a semiconductor wafer and method of fabricating the same in accordance with an embodiment of the invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will help convey the scope of the invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter will be described exemplary embodiments of the invention in conjunction with the accompanying drawings.

FIGS. 1 through 6 are sectional views illustrating a semiconductor wafer and method of fabricating the same in accordance with an embodiment of the invention.

Referring to FIG. 1, a semiconductor pattern 12 with a second crystallographic orientation is selectively formed on a semiconductor substrate 10 having a first crystallographic orientation. The semiconductor substrate 10 and the semiconductor pattern 12 may be group IV semiconductors, III/V-group compound semiconductors, and/or II/VI-group compound semiconductors. For example, the semiconductors may be Si, Ge alloy, SiGe, SiC, SiGeC, GaAs, and InP. The semiconductor pattern 12 may be completed by forming and patterning a semiconductor layer with the second crystallographic orientation on the semiconductor substrate 10. For instance, after bonding the semiconductor substrate 10 of the first crystallographic orientation with another semiconductor substrate of the second crystallographic orientation, another semiconductor substrate of the second crystallographic orientation is thinned or polished to form the semiconductor layer of the second crystallographic orientation on the semiconductor substrate 10. The thinning of the semiconductor substrate may be carried out by injecting hydrogen ions at a certain depth to form a hydroionic layer, and conducting a thermal treatment to separate the upper and lower portions of the semiconductor substrate at the hydroionic layer. Other methods, known in the art, for forming a crystalline semiconductor layer on a substrate may also be suitably used to form the semiconductor pattern 12.

The semiconductor pattern 12 is arranged to correspond with regions including unit elements operated by charge carriers with high mobility in relation to the second crystallographic orientation in a semiconductor device. Semiconductor layers may be formed by an epitaxial growth on the semiconductor substrate 10 and the semiconductor pattern 12. Thereby, on the semiconductor pattern 10, a semiconductor layer 10a is formed from the epitaxial growth in the same crystallographic orientation with the semiconductor substrate 10. And, on the semiconductor pattern 12, the semiconductor layer 12a is formed from the epitaxial growth in the same crystallographic orientation with the semiconductor pattern 12. The epitaxially grown semiconductor layers 10a and 12a may comprise a material having substantially the same crystallographic orientation with, or different from, the semiconductor layer of the initial surface. The semiconductor substrate 10 and the semiconductor pattern 12 may act as seed layers for the epitaxial growth of layers 10a and 12a, respectively.

The semiconductor substrate 10 and the semiconductor pattern 12 are configured with step differences. If the epitaxial layers grow up in the speed independent of the crystallographic orientation, the semiconductor layers 10a and 12a have step differences on their upper surfaces. But, if the epitaxial growth progresses depending on the crystallographic orientation, it is desirable that the epitaxial layer grow up faster on the semiconductor substrate 10 of which top surface is lower than a top surface the semiconductor pattern 12. As an example, the rates of epitaxial growth for the crystallographic orientations (100), (110), and (111) are known as 1.0 μ/min, 1.2 μ/min, and 0.6 μ/min, respectively, in some semiconductor materials. Thus, it is preferred to make the semiconductor substrate 10 have the (110) orientation and to make the semiconductor pattern 12 have the (100) orientation, which acts to lessen surface unevenness of the semiconductor layers 10a and 12a due to the step differences.

Figure 2:
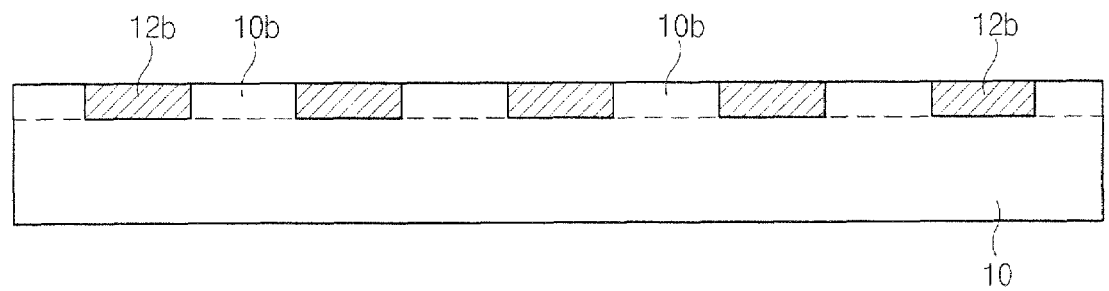
Figure 3:
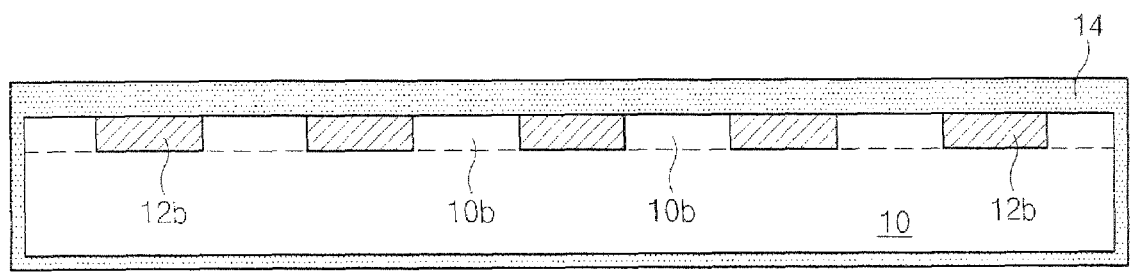

Referring to FIG. 2, the semiconductor layers 10a and 12a epitaxially grown on the semiconductor substrate 10 and the semiconductor pattern 12 are polished to formed a flattened face including a surface of the semiconductor layer 10b with the first crystallographic orientation and a surface of the semiconductor layer 12b with the second crystallographic orientation. According to the amount of polishing, the semiconductor layer 12b with the second crystallographic orientation may be the semiconductor pattern 12, or a stacked layer of the semiconductor pattern 12 and the epitaxially grown semiconductor layer 12a.

Referring to FIG. 3A, an insulation film 14 is then deposited on the flattened face. The insulation film 14 may comprise silicon oxide, silicon nitride, or another insulation material. The insulation film 14 may be formed by a thermal process in an atmosphere of oxygen, hydrogen, or other gas, or by chemical vapor deposition. During this process, the insulation film 14 can also be formed on the sides of the substrate and the back side of the flattened layer.

Figure 4:
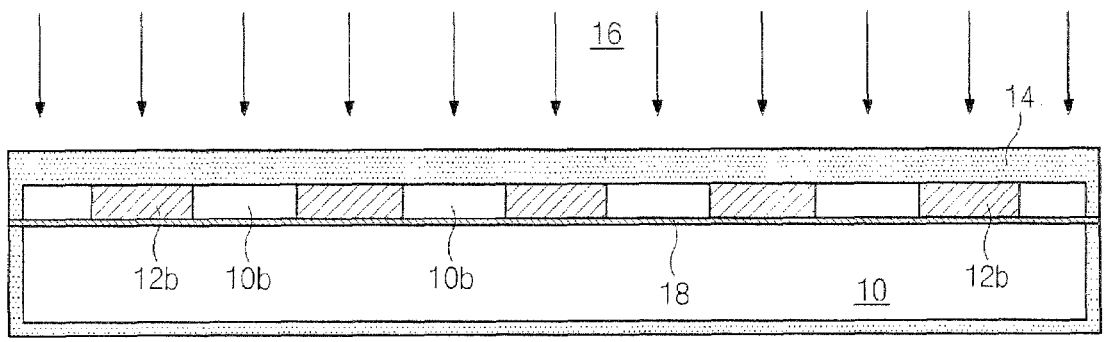

Next, referring to FIG. 4, impurity ions such as hydrogen ions 16 are injected into an interface between the semiconductor substrate 10 and the semiconductor layers 10b and 12b under the insulation film 14, with a pre-determined projection range. Thus, a hydroionic layer 18 is formed at the interfaces between the semiconductor substrate 10 and the semiconductors 10b and 12b.

Figure 5:
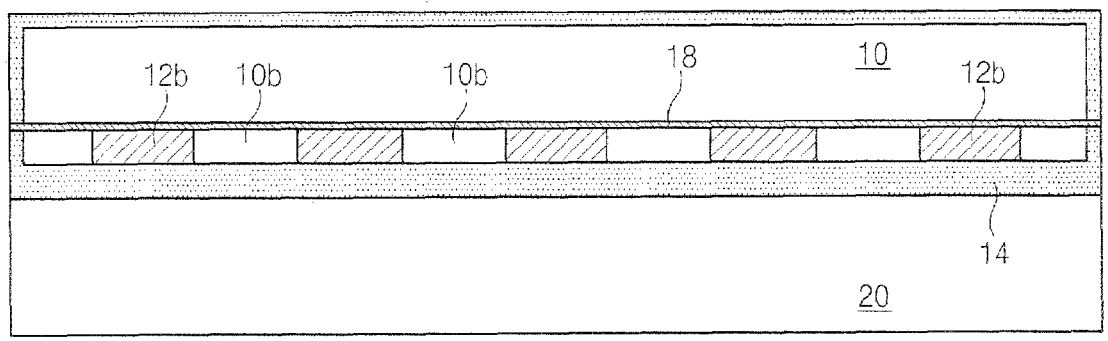

Referring to FIG. 5, a base substrate 20 is prepared. The substrate 10 including the insulation film 14 is bonded to the base substrate 20, the insulation film 14 being in contact with the base substrate 20. The insulation film 14 may be bonded to the base substrate 20 by heating them in an atmosphere of inert gas under constant temperature for several cycles. During this process, both substrates may be pressed together to facilitate bonding.

Although not shown, in order to make the bonding easier, it is possible for the base substrate 20 to be comprised of an insulation film on the side to be bonded, similar to or the same as the insulation film 14 of the substrate.

Figure 6:
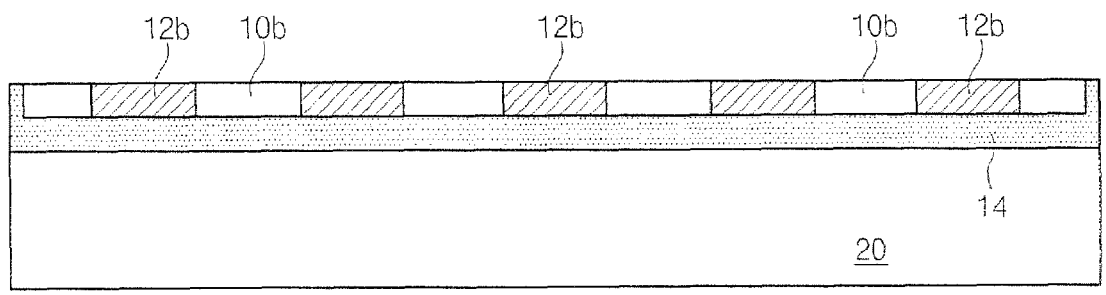

Referring to FIG. 6, heat is applied to the resultant structure bonded to the base substrate 20. Thereby, the hydrogen of the hydrogen injection layer 18 is activated to make the upper and lower substrates separate from each other at the hydrogen injection layer 1 8. Thus, the semiconductor substrate 10 is removed from the base substrate 20 at the hydrogen injection layer 18. The surface from which the semiconductor substrate 10 is removed may be processed with a surface treatment such as grinding and/or polishing.

The separation of the semiconductor substrate 10 from the semiconductor layers 10b and 12b may be accomplished without using the hydrogen injection. For instance, the semiconductor substrate 10 may be polished until the semiconductor layers 10b and 12b are exposed. According to some embodiments, the semiconductor substrate may be removed by etching. According to other embodiments, the removal of the semiconductor substrate may be accomplished by implanting ions other than hydrogen, in which case layer 18 would be a separation layer rather than a hydrogen injection layer.

Regardless of which processing method is used for the separation and removal of the substrate 10 from the semiconductor layers 10b and 12b, the insulation film 14 is still formed on the base substrate 20, completing the substrate structure with the semiconductor layer 10b of the first crystallographic orientation and the semiconductor layer 12b of the second crystallographic orientation located on the insulation film 14. The semiconductor layer 10b of the first crystallographic orientation may be used as a first conductivity region in the semiconductor device, while the semiconductor layer 12b of the second crystallographic orientation may be used as a second conductivity region, which is complementary to the first conductivity region, in the semiconductor device. The first and second conductivity regions are operable with minority charge carriers that have high mobility respective to the first and second crystallographic orientations. For instance, the semiconductor layer of the (100) crystallographic orientation becomes a P-well, for an NMOS transistor, which is operable with electrons as minority carriers. The semiconductor layer of the (110) crystallographic orientation becomes an N-well, for a PMOS transistor, which is operable with holes as minority carriers. Thus, it improves the NMOS transistor that uses electrons as majority carriers in high mobility to the (100) crystallographic orientation, as well as the PMOS transistor that uses holes as majority carriers in high mobility to the (110) crystallographic orientation.

As it is possible to provide the transistors with channel structures of full depletion channel or full inversion channel in accordance with a polished thickness of the semiconductor layers 10b and 12b on the insulation film 14, the semiconductor layers 10b and 12b may be selectively configured in thickness to correspond with requirements according to the semiconductor devices.

Figure 7:
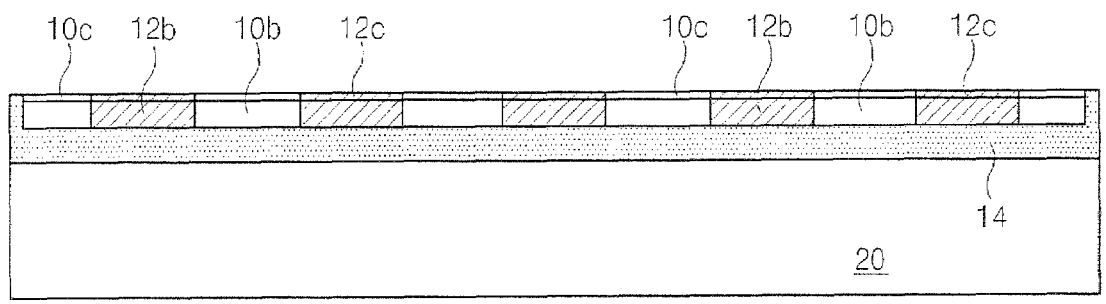
FIG. 7 is a sectional view illustrating a semiconductor wafer and method of fabricating the same in accordance with another embodiment of the invention.

The semiconductor layers 10b and 12b may be damaged on the surface by the hydrogen ion injection, or the grinding/polishing operation. FIG. 7 illustrates an embodiment of the invention, capable of eliminating the surface defects on the semiconductor layers 10b and 12b.

Referring to FIG. 7, the surfaces of the semiconductor layers 10b and 12b are treated to activate dangling bonds. For instance, the surfaces of the semiconductor layers 10b and 12b are treated in hydrogen chloride, activating dangling bonds on the surfaces. During this process, a portion of the surfaces of the semiconductor layers 10b and 12b may be removed. An epitaxial layer may then be grown on the semiconductor layers 10b and 12b. Namely, a surface layer 10c of the first crystallographic orientation grows up on the semiconductor layer 10b of the first crystallographic orientation, while a surface layer 12c of the second crystallographic orientation grows up on the semiconductor layer 12b of the second crystallographic orientation. The layers 10b and 12b may be seed layers for the epitaxial growth of surface layers 10c and 12c, respectively. The surface layers 10c and 12c are used as regions in which transistor channels are arranged, which may be completed by forming buffering layers on a reference level and forming strained channels on the buffering layers. As an example, the buffering layers may be formed with silicon/germanium layers made up with varying germanium concentration, e.g., reducing the concentration of germanium and then silicon layers may be formed on the buffering layers to complete the strained silicon channels for the transistors.

As mentioned previously, utilizing the fact that the mobility of charges are dependent on crystallographic orientation, the NMOS transistor operable with electrons as charge carriers is formed in the (100)-oriented substrate while the PMOS transistor operable with holes as charge carriers is formed in the (110)-oriented substrate. Thus, it is possible to improve the performance of the NMOS and PMOS transistors, providing the capability for high-performance semiconductor devices by forming other active and passive elements in consideration of the crystallographic orientation and charge mobility.

According to some embodiments, the method of fabricating a semiconductor wafer comprises forming a semiconductor pattern having a second crystallographic orientation on a predetermined region of a semiconductor substrate having a first crystallographic orientation, and epitaxially growing a semiconductor layer, which has the first and second crystallographic orientations, on the semiconductor substrate and the semiconductor pattern. The semiconductor layer is formed such that one part grows up on the semiconductor substrate in the first crystallographic orientation while the other part grows up on the semiconductor substrate in the second crystallographic orientation. The speed of epitaxial growth may be dependent on the crystallographic orientation. As the semiconductor substrate is different from the semiconductor pattern in height, it is able to reduce the height difference over the semiconductor layer between the semiconductor substrate and the semiconductor pattern by arranging the semiconductor substrate, which is leveled lower than the semiconductor pattern, to have the crystallographic orientation faster than the other in speed of growth.

The method may further comprise polishing the semiconductor layer to form a flattened face that includes regions arranged each in the first and second crystallographic orientations, forming an insulation film on the flattened face, attaching the insulation film to a base substrate; and removing a portion of the semiconductor substrate to expose a semiconductor layer that includes surface regions arranged each in the first and second crystallographic orientations. As a result, the semiconductor wafer is completed having the semiconductor layer that includes regions arranged in the crystallographic orientations different from each other on the insulation film of the base substrate.

According to some embodiments of the invention, since the semiconductor layers, different in crystallographic orientation, are formed on the insulation film and selectively controlled in thickness, it is possible to provide the structure of full depletion or inversion channels for the transistors. Therefore, the invention prevents malfunctions of the transistors due to the abnormal migration of charges and restrains leakage currents.

Moreover, the invention is advantageous to preventing the generation of leakage currents by forming the surface layers with low density of defects on the top layers of the substrate, and further enhancing operational speeds of the unit elements by rendering the surface layers to contain strained channels.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor wafer, the method comprising:

forming a semiconductor pattern having a second crystallographic orientation on a region of a semiconductor substrate having a first crystallographic orientation;

epitaxially growing a semiconductor layer, which has the first and second crystallographic orientations, on the semiconductor substrate and the semiconductor pattern, respectively;

polishing the semiconductor layer to form a flattened face that includes regions arranged in the first and second crystallographic orientations;

forming an insulation film on the flattened face;

bonding the insulation film to a base substrate; and removing a portion of the semiconductor substrate to expose the semiconductor layer that includes surface regions arranged in the first and second crystallographic orientations.

2. The method as set forth in claim 1, which further comprises:
   etching the surface regions to activate dangling bonds of the surface of the semiconductor layer; and
   epitaxially growing surface layers on the surface regions, at which the dangling bonds are activated, the surface layers having substantially the same crystallographic orientations as the surface regions.

3. The method as set forth in claim 2, wherein epitaxially growing the surface layers comprises:
   epitaxially growing buffering layers on the activated surface of the semiconductor layer; and
   forming strained channel layers on the buffering layers.

4. The method as set forth in claim 2, wherein an epitaxial growth rate is dependent on the crystallographic orientation of the surface regions and advanced faster in the first crystallographic orientation than the second crystallographic orientation.

5. The method as set forth in claim 4, wherein the semiconductor substrate has the (110) crystallographic orientation while the semiconductor pattern has the (100) crystallographic orientation.

6. The method as set forth in claim 2, which further comprises:
   forming a hydrogen injection layer at an interface between the semiconductor substrate and the epitaxially grown semiconductor layer; and
   treating the semiconductor substrate, which is bonded to the base substrate, by heat and separating a portion of the semiconductor substrate from the semiconductor layer at the hydrogen injection layer.

7. The method as set forth in claim 2, wherein the semiconductor substrate and the semiconductor pattern comprise group IV semiconductors, III/V-group compound semiconductors, or II/VI-group compound semiconductors.

8. The method of claim 1, wherein the epitaxially grown semiconductor layer having the first and second crystallographic orientations extends continuously over the semiconductor substrate and over the semiconductor pattern.

* * * * *